(12) United States Patent
Kang

(10) Patent No.: US 7,459,754 B2
(45) Date of Patent: Dec. 2, 2008

(54) SEMICONDUCTOR DEVICE HAVING ESD PROTECTION CIRCUIT WITH TIME DELAY

(75) Inventor: Seung-won Kang, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 13 days.

(21) Appl. No.: 11/337,012

(22) Filed: Jan. 20, 2006

(65) Prior Publication Data

US 2006/0163616 A1    Jul. 27, 2006

(30) Foreign Application Priority Data

Jan. 27, 2005  (KR)  ............... 10-2005-0007626

(51) Int. Cl.
*H01L 23/62* (2006.01)
(52) U.S. Cl. ............... 257/363; 257/355; 257/358; 257/359; 257/E27.016; 257/E27.033
(58) Field of Classification Search ........... 257/173, 257/355, 358, 359, 363, E27.016, E27.033
See application file for complete search history.

(56) References Cited

U.S. PATENT DOCUMENTS 6,198,136 B1    3/2001    Voldman et al. ......... 257/357
2002/0084490 A1    7/2002    Ker et al.
2002/0119608 A1 *    8/2002    Ko et al. .............. 438/152
2004/0232492 A1 *    11/2004    Ker et al. .............. 257/355

FOREIGN PATENT DOCUMENTS

| JP | 11-289056 | 10/1999 |
| JP | 2003-197754 | 7/2003 |
| KR | 10-2000-0055561 | 9/2000 |
| KR | 10-2002-0032163 | 5/2002 |

* cited by examiner

*Primary Examiner*—Matthew E Warren
(74) *Attorney, Agent, or Firm*—Mills & Onello LLP

(57) ABSTRACT

Provided is a semiconductor device in which a resistor and a capacitor are inserted in an input/output signal line that connects an input/output pad and an internal circuit at an input/output terminal in order to prevent damage of the internal circuit due to static electricity. The semiconductor device includes the input/output signal line that connects the input/output pad and the internal circuit. A first electrostatic discharge (ESD) protection circuit is branched from the input/output pad and connected to a power supply line, and a second ESD protection circuit is branched from the input/output pad and connected to a ground line. The resistor is located in the input/output signal line, and the capacitor is branched from the power supply line between the power supply line and the resistor.

15 Claims, 2 Drawing Sheets

SEMICONDUCTOR DEVICE HAVING ESD PROTECTION CIRCUIT WITH TIME DELAY

CROSS-REFERENCE TO RELATED PATENT APPLICATION

This application claims the benefit of Korean Patent Application No. 10-2005-0007626, filed on Jan. 27, 2005, in the Korean Intellectual Property Office, the contents of which are incorporated herein in their entirety by reference.

BACKGROUND OF THE INVENTION

1. Field of the Invention

The present invention relates to a semiconductor device, and more particularly, to a semiconductor device having an internal circuit that is in contact with an external element through an input/output pad.

2. Description of the Related Art

A semiconductor integrated circuit, which is fabricated using complementary metal-oxide-semiconductor (CMOS) technology, is susceptibly to the effects caused by a high voltage flowing from static electricity or electrostatic discharge (ESD) that is generated due to contact with a human body or the like. The ESD phenomenon easily causes the break of a thin insulating layer formed in the integrated circuit or the malfunction of an integrated circuit chip, e.g., a channel short circuiting, because a high voltage is applied to the integrated circuit chip at once. When static electricity generated from a regulated power supply contacts a lead of a semiconductor product, it is input as an impulse type signal to the semiconductor product through the lead. The input static electricity passes through a path from the lead to a ground line, which provides the minimum product of electric potential and time, and is discharged from the semiconductor product while inflicting damage on the semiconductor product. In most cases, a circuit is designed to lead a path of damage due to static electricity to an ESD protection circuit (refer to U.S. Pat. No. 6,198,136 B1). However, in spite of such circuit design, there have been many cases where semiconductor products, especially, internal circuits, are seriously affected by static electricity.

FIG. 1 is a circuit diagram of a conventional semiconductor device 10 having ESD protection circuits.

Referring to FIG. 1, the conventional semiconductor device 10 includes ESD protection circuits 24, which are between a power supply line 12 to which an external voltage Vcc is applied and a ground line (Gnd) 14. The ESD protection circuits 24 are connected to two diodes D1 and D2, respectively, which are branched from an input/output pad 20.

In the conventional semiconductor device 10, if an electric potential is lower in a first path between a lead 32 and the ground line 14, which goes by way of an input/output signal line 22 and an internal circuit 30, than in a second path between the lead 32 and the ground line 14, which goes by way of the ESD protection circuit 24, and if a sink time, which is a time taken to discharge static electricity input from the lead 32 through the ground line 14, is shorter in the first path than in the second path, static electricity ends up passing through the input/output signal line 22 and the internal circuit 30. In this case, the internal circuit 30 is fatally damaged by the static electricity.

SUMMARY OF THE INVENTION

The present invention provides a semiconductor device having an input/output terminal that can prevent damage to an internal circuit due to static electricity even if an electric potential is low in a path from an external regulated power supply to the internal circuit.

According to an aspect of the present invention, there is provided a semiconductor device including an internal circuit disposed on a substrate; an input/output pad connected between a lead for external contact and the internal circuit; and an input/output signal line that connects the input/output pad and the internal circuit. A first electrostatic discharge (ESD) protection circuit is branched from the input/output pad and connected to a power supply line, and a second ESD protection circuit is branched from the input/output pad and connected to a ground line. A first resistor is located in the input/output signal line, and a capacitor is branched from the power supply line and connected between the power supply line and the first resistor.

The capacitor may include a first electrode including the first resistor; a second electrode connected to the power supply line; and an insulating layer interposed between the first and second electrodes.

Each of the first and second ESD protection circuits may be comprised of a diode.

The first resistor can include an impurity diffusion region disposed in the substrate.

In this aspect, the semiconductor device may further include a second resistor that is branched from the power supply line and connected between the power supply line and the capacitor.

According to another aspect of the present invention, there is provided a semiconductor device including an internal circuit disposed on a substrate; an input/output pad connected between a lead for external contact and the internal circuit; an input/output signal line that connects the input/output pad and the internal circuit; a resistor located in the input/output signal line; and a capacitor including an electrode that is integrally formed with the resistor, the capacitor connected to a power supply line.

In one embodiment, the capacitor comprises: a first electrode that is integrally formed with the resistor; a second electrode connected to the power supply line; and an insulating layer interposed between the first and second electrodes.

In one embodiment, the resistor includes an impurity diffusion region disposed in the substrate.

In one embodiment, the device further comprises: a first ESD protection circuit branched from the input/output pad and connected to the power supply line; and a second ESD protection circuit branched from the input/output pad and connected to a ground line. In one embodiment, each of the first and second ESD protection circuits is comprised of a diode.

According to still another aspect of the present invention, there is provided a semiconductor device including an internal circuit disposed on a substrate; an input/output pad connected between a lead for external contact and the internal circuit; an input/output signal line that connects the input/output pad and the internal circuit; a first resistor located in the input/output signal line; a capacitor including an electrode that is integrally formed with the first resistor, the capacitor connected to a power supply line; and a second resistor branched from the power supply line and connected between the power supply line and the capacitor.

In one embodiment, the capacitor comprises: a first electrode that is integrally formed with the first resistor; a second electrode connected to the power supply line; and an insulating layer interposed between the first and second electrodes.

In one embodiment, the first resistor includes an impurity diffusion region disposed in the substrate.

The device can further include: a first ESD protection circuit branched from the input/output pad and connected to the power supply line; and a second ESD protection circuit branched from the input/output pad and connected to a ground line. In one embodiment, each of the first and second ESD protection circuits is comprised of a diode.

According to the present invention, even if an electric potential is low in the input/output signal line that is externally connected to the internal circuit, a time delay is caused to prevent damage of the internal circuit due to static electricity.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

Figure 1:
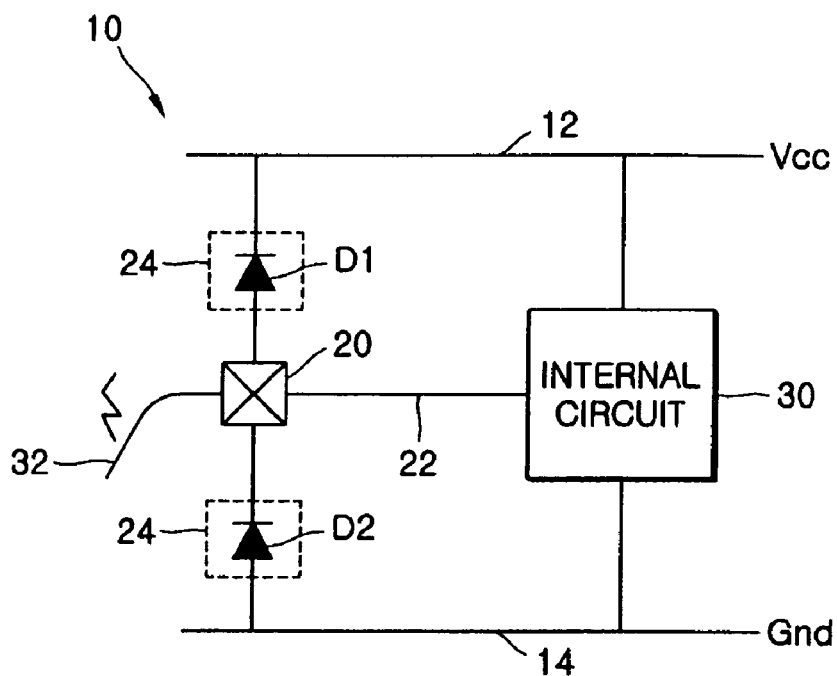
FIG. 1 is a circuit diagram of a conventional semiconductor device.
Figure 2:
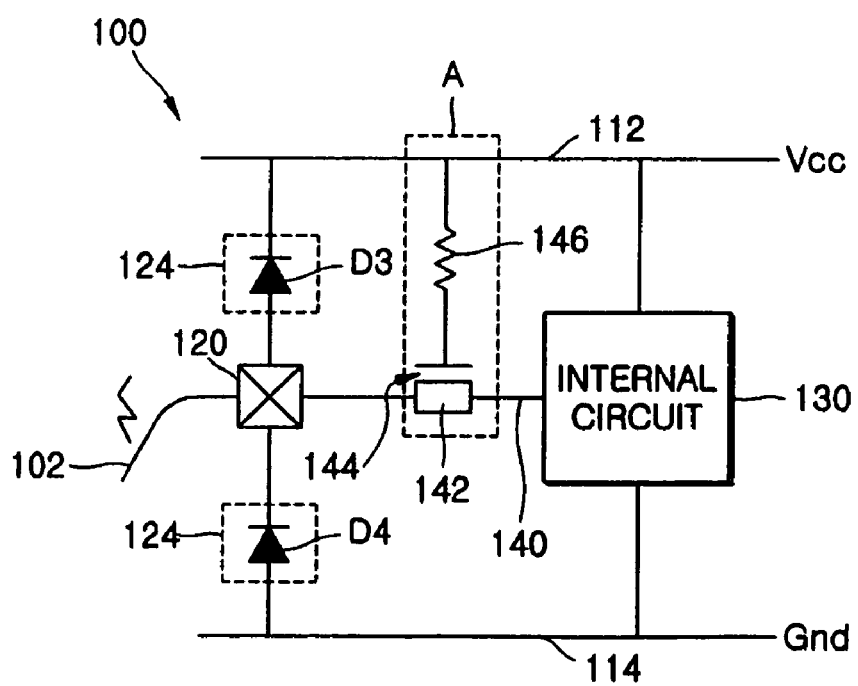
FIG. 2 is a circuit diagram of a portion of a semiconductor device according to an exemplary embodiment of the present invention.

FIG. 2 is a circuit diagram of portion of a semiconductor device 100 according to an exemplary embodiment of the present invention.

Referring to FIG. 2, in an input/output terminal of the semiconductor device 100 according to the present invention, an input/output pad 120 is located between a lead 102 for external contact and an internal circuit 130 disposed on a substrate. The input/output pad 120 and the internal circuit 130 are connected to each other by an input/output signal line 140.

Also, a first diode D3 and a second diode D4 are branched from the input/output pad 120 and connected to a power supply line 112 to which an external voltage Vcc is applied and a ground line (Gnd) 114, respectively. Each of the first and second diodes D3 and D4 constitutes an electrostatic discharge (ESD) protection circuit 124.

A first resistor 142 as a junction resistor is located in the input/output signal line 140, and a capacitor 144 is located on the first resistor 142. The capacitor 144 is branched from the power supply line 112 and connected between the power supply line 112 and the first resistor 142.

The capacitor 144 is connected to a second resistor 146, which is branched from the power supply line 112.

Figure 3:
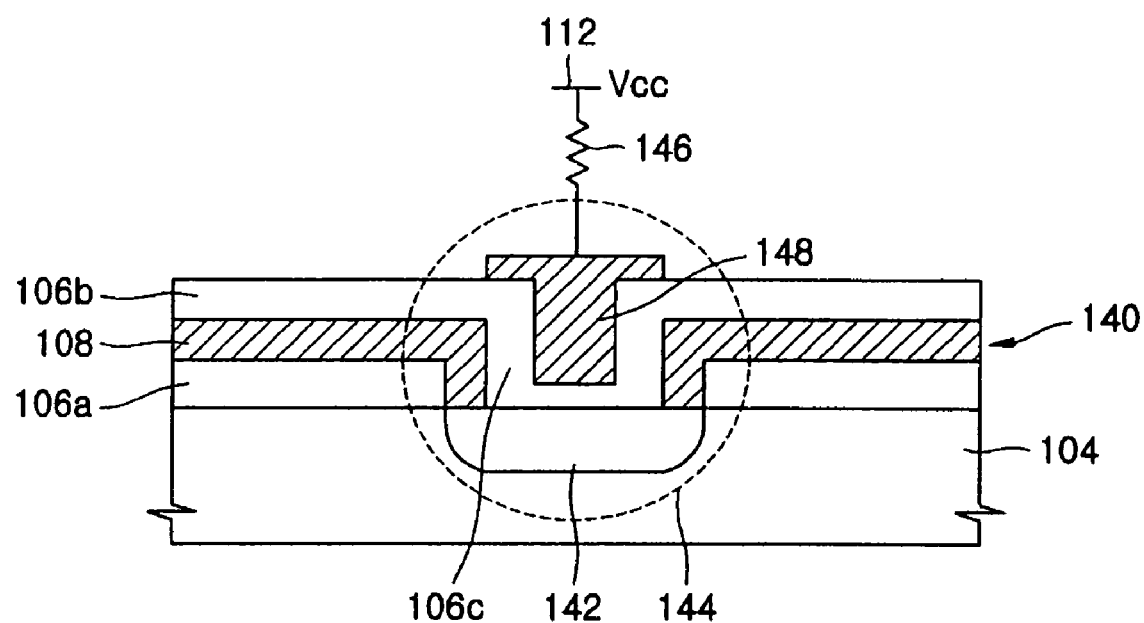
FIG. 3 is a cross sectional view of a resistor and capacitor that are located in an input/output signal line of the semiconductor device shown in FIG. 2.

FIG. 3 is a cross sectional view of a portion "A" of FIG. 2.

Referring to FIG. 3, the input/output signal line 140 is disposed on a substrate 104, for example, a silicon substrate. The input/output signal line 140 includes a metal line 108, which is coated with insulating layers 106a, 106b, and 106c.

The first resistor 142 includes an impurity diffusion region that is disposed in the substrate 104. The capacitor 144 includes a first electrode, which is comprised of the first resistor 142, and a second electrode 148, which is connected to the power supply line 112 through the second resistor 146.

That is, the first electrode of the capacitor 144 is integrally formed with the first resistor 142. The first electrode comprised of the first resistor 142 and the second electrode 148 constitute the capacitor 144 along with the insulating layer 106c interposed between the first electrode and the second electrode 148.

As described above with reference to FIGS. 2 and 3, in the input/output terminal of the semiconductor device 100 according to the present invention, the first resistor 142 is inserted in the input/output signal line 140 that connects the input/output pad 120 and the internal circuit 130, and the capacitor 144 is located on the first resistor 142, thus providing a bias.

Accordingly, even if an electric potential is lower in the internal circuit 130 than in the ESD protection circuit 124 and even if a sink time, which is a time taken to discharge static electricity input from the lead 102 through the ground line 114, is shorter in the internet circuit 130 than in the ESD protection circuit 124, when the static electricity flows into the input/output signal line 140, a delay is generated due to the first resistor 142 of the capacitor 144, and the capacitor 144 is instantaneously charged with electricity. Owing to such mechanism, when static electricity output from the input/output signal line 140 passes through the first resistor 142, an instantaneous potential of the static electricity is almost infinitely high, so that the internal circuit 130 can be protected from the static electricity.

Furthermore, when the semiconductor device 100 according to the present invention performs a normal function, the capacitor 144 remains charged with electricity due to an external supply voltage Vcc and thus, a delay can be minimized.

In the semiconductor device according to the present invention, a resistor is inserted in an input/output signal line that connects an input/output pad and an internal circuit at an input/output terminal, and a capacitor is located on the resistor to provide a bias. Thus, when no power is supplied, input impedance is maximized. As a result, even if an electric potential is low in the input/output signal line that is externally connected to the internal circuit, a time delay is caused to prevent damage of the internal circuit due to static electricity.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
an internal circuit disposed on a substrate;
an input/output pad connected between a lead for external contact and the internal circuit;
an input/output signal line that connects the input/output pad and the internal circuit;
a first electrostatic discharge (ESD) protection circuit disposed on a first branch between the input/output signal line and a power supply line;
a second ESD protection circuit disposed on a second branch connected between the input/output signal line and a ground line;
a junction resistor located in the input/output signal line between the first branch and the internal circuit; and
a capacitor also located on the input/output signal line between the first branch and the internal circuit, the capacitor having a first electrode comprising the junction resistor and a second electrode connected to the power supply line via a third branch that is parallel to the first branch.

2. The device according to claim 1, wherein the capacitor comprises:
an insulating layer interposed between the first and second electrodes.

3. The device according to claim 1, wherein each of the first and second ESD protection circuits is comprised of a diode.

4. The device according to claim 1, wherein the first resistor includes an impurity diffusion region disposed in the substrate.

5. The device according to claim 1, further comprising a second resistor located on the third branch, the second resistor connected between the power supply line and the second electrode of the capacitor.

6. A semiconductor device comprising:
an internal circuit disposed on a substrate;
an input/output pad connected between a lead for external contact and the internal circuit;
an input/output signal line that connects the input/output pad and the internal circuit;
a junction resistor located in the input/output signal line between the input/output pad and the internal circuit; and
a capacitor, also located on the input/output signal line between the input/output pad and the internal circuit, including a first electrode comprising the junction resistor and a second electrode connected to a power supply line.

7. The device according to claim 6, wherein the capacitor comprises:
an insulating layer interposed between the first and second electrodes.

8. The device according to claim 6, wherein the resistor includes an impurity diffusion region disposed in the substrate.

9. The device according to claim 6, further comprising:
a first ESD protection circuit branched from the input/output pad and connected to the power supply line, the first ESD protection circuit being disposed in parallel with a branch connecting the second electrode to the power supply line; and
a second ESD protection circuit branched from the input/output pad and connected to a ground line.

10. The device according to claim 9, wherein each of the first and second ESD protection circuits is comprised of a diode.

11. A semiconductor device comprising:
an internal circuit disposed on a substrate;
an input/output pad connected between a lead for external contact and the internal circuit;
an input/output signal line that connects the input/output pad and the internal circuit;
a first resistor located in the input/output signal line between the input/output pad and the internal circuit;
a capacitor, also located on the input/output signal line between the input/output pad and the internal circuit, including a first electrode comprising the first resistor and a second electrode connected to a power supply line; and
a second resistor connected between the power supply line and the second electrode of the capacitor.

12. The device according to claim 11, wherein the capacitor comprises:
an insulating layer interposed between the first and second electrodes.

13. The device according to claim 11, wherein the first resistor includes an impurity diffusion region disposed in the substrate.

14. The device according to claim 11, further comprising:
a first ESD protection circuit branched from the input/output pad and connected to the power supply line, the first ESD protection circuit being disposed in parallel with a branch connecting the second electrode to the power supply line; and
a second ESD protection circuit branched from the input/output pad and connected to a ground line.

15. The device according to claim 14, wherein each of the first and second ESD protection circuits is comprised of a diode.

* * * * *